United States Patent
Zhang et al.

(10) Patent No.: US 12,156,451 B2
(45) Date of Patent: Nov. 26, 2024

(54) DISPLAY SUBSTRATE, DISPLAY DEVICE AND HIGH-PRECISION METAL MASK

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guomeng Zhang, Beijing (CN); Yan Huang, Beijing (CN); Ming Hu, Beijing (CN); Tong Niu, Beijing (CN); Qian Xu, Beijing (CN); Chang Luo, Beijing (CN); Jianpeng Wu, Beijing (CN); Peng Xu, Beijing (CN); Fengli Ji, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 385 days.

(21) Appl. No.: 17/596,742

(22) PCT Filed: Nov. 30, 2020

(86) PCT No.: PCT/CN2020/132847
§ 371 (c)(1),
(2) Date: Dec. 16, 2021

(87) PCT Pub. No.: WO2022/110173
PCT Pub. Date: Jun. 2, 2022

(65) Prior Publication Data
US 2023/0143544 A1 May 11, 2023

(51) Int. Cl.
*H10K 59/35* (2023.01)
*C23C 14/04* (2006.01)
(Continued)

(52) U.S. Cl.
CPC .......... *H10K 59/353* (2023.02); *C23C 14/04* (2013.01); *H10K 59/122* (2023.02);
(Continued)

(58) Field of Classification Search
CPC .......................... H10K 59/352; H10K 59/353
See application file for complete search history.

(56) References Cited

U.S. PATENT DOCUMENTS

2014/0319484 A1 10/2014 Kwon
2015/0200237 A1 7/2015 Yim et al.
(Continued)

FOREIGN PATENT DOCUMENTS

CN 104124265 A 10/2014
CN 208077981 U 11/2018
(Continued)

OTHER PUBLICATIONS

Machine translation, Liu, Chinese Pat. Pub. No. CN111341817A, translation date: Mar. 2, 2024, Espacenet, all pages. (Year: 2024).*

*Primary Examiner* — Victoria K. Hall
(74) *Attorney, Agent, or Firm* — McCoy Russell LLP

(57) ABSTRACT

A display substrate, a display device, a high-precision metal mask are provided. The display substrate includes first, second, third sub-pixels. In first direction, first and third sub-pixels are alternated to form first sub-pixel rows, second sub-pixels form second sub-pixel rows. In second direction, first and second sub-pixel rows are alternated, first direction is approximately perpendicular to second direction. Two first and two third sub-pixels in two adjacent rows and two adjacent columns form a 2*2 array, in the array, two first sub-pixels are in different rows and different columns, two third sub-pixels are in different rows and different columns, at least one of two first and two third sub-pixels is a pattern where corner is cut off, connection lines of centers of two (Continued)

first and two third sub-pixels form non-square virtual quadrilateral, and second sub-pixel is within virtual quadrilateral. The display effect can be improved.

17 Claims, 7 Drawing Sheets

(51) Int. Cl.
  *H10K 59/122* (2023.01)
  *H10K 71/00* (2023.01)
  *H10K 71/16* (2023.01)
(52) U.S. Cl.
  CPC ........... *H10K 59/352* (2023.02); *H10K 71/00* (2023.02); *H10K 71/166* (2023.02)

(56) References Cited

U.S. PATENT DOCUMENTS

| | | | |
|---|---|---|---|
| 2018/0342571 A1* | 11/2018 | Kwon | H10K 59/353 |
| 2019/0252469 A1* | 8/2019 | Xiao | H10K 59/122 |
| 2021/0257422 A1 | 8/2021 | Xu | |
| 2021/0343801 A1 | 11/2021 | Wang et al. | |
| 2022/0208891 A1* | 6/2022 | Liu | H10K 59/353 |

FOREIGN PATENT DOCUMENTS

| | | | | |
|---|---|---|---|---|
| CN | 109994508 A | | 7/2019 | |
| CN | 110867481 A | | 3/2020 | |
| CN | 111341817 A | * | 6/2020 | ........... H10K 59/353 |
| CN | 111969005 A | | 11/2020 | |

* cited by examiner

DISPLAY SUBSTRATE, DISPLAY DEVICE AND HIGH-PRECISION METAL MASK

CROSS REFERENCE TO RELATED APPLICATION

The present application is a U.S. National Phase of International Application No. PCT/CN2020/132847 entitled "DISPLAY SUBSTRATE, DISPLAY DEVICE AND HIGH-PRECISION METAL MASK," and filed on Nov. 30, 2020. The entire contents of the above-listed application is hereby incorporated by reference for all purposes.

TECHNICAL FIELD

The present disclosure relates to the field of display technology, and in particular to a display substrate, a display device and a high-precision metal mask.

BACKGROUND

An organic light-emitting diode (OLED) display device includes a base substrate, a light-emitting layer, and an encapsulation protection layer. The light-emitting layer includes sub-pixels arranged in an array on the base substrate. For each sub-pixel, a fine metal mask (FMM) is generally used to evaporate an organic light-emitting material onto the corresponding sub-pixel position of the array substrate. With the progress of the society, people have increasingly high requirements for resolution of display devices.

At present, limited to production level of the FMM and precision of the evaporation process, it is difficult to increase the resolution by reducing sub-pixel sizes and reducing pixel pitches. At present, a commonly used method is sub-pixel rendering (SPR) technology, i.e., sub-pixels at some positions are shared by different pixels, so as to use relatively few sub-pixels to simulate a higher resolution. However, in the pixel arrangement structure in the conventional technologies, brightness centers of virtual pixels usually have a nonuniform distribution. As a result, when some characters and specific graphics are displayed, graininess and distortion of the display are inevitably caused.

SUMMARY

In view of the above, the present disclosure provides a display substrate, a display device, and a high-precision metal mask, which are used to solve the problem of graininess and distortion of display caused by nonuniform arrangement of brightness centers of virtual pixels of the pixel arrangement structure in the conventional technologies.

In order to solve the above technical problem, the present disclosure is implemented as follows.

In a first aspect, a display substrate is provided, including first sub-pixels, second sub-pixels and third sub-pixels; where in a first direction, the first sub-pixels and the third sub-pixels are arranged alternately to form first sub-pixel rows, and the second sub-pixels form second sub-pixel rows; where in a second direction, the first sub-pixel rows and the second sub-pixel rows are arranged alternately, and the first direction is approximately perpendicular to the second direction; where two first sub-pixels and two third sub-pixels in two adjacent rows and two adjacent columns form a 2*2 array, in the 2*2 array, the two first sub-pixels are in different rows and in different columns, the two third sub-pixels are in different rows and in different columns, at least one sub-pixel of the two first sub-pixels and the two third sub-pixels is a pattern where a corner is cut off, connection lines of centers of the two first sub-pixels and the two third sub-pixels form a virtual quadrilateral that is non-square, and a second sub-pixel is within the virtual quadrilateral.

Optionally, the at least one sub-pixel of the two first sub-pixels and the two third sub-pixels has a shape of a square where a corner is cut off.

Optionally, the at least one sub-pixel of the two first sub-pixels and the two third sub-pixels is a pattern where one corner is cut off, a pattern where two corners are cut off or a pattern where three corners are cut off.

Optionally, for the two first sub-pixels corresponding to a same virtual quadrilateral, positions where corners are cut off are the same or different; or, for the two third sub-pixels corresponding to a same virtual quadrilateral, positions where corners are cut off are the same or different.

Optionally, the two first sub-pixels and the two third sub-pixels corresponding to a same virtual quadrilateral surround a second sub-pixel, and a minimum distance among distances from other first sub-pixels and other third sub-pixels outside the same virtual quadrilateral to the surrounded second sub-pixel is greater than a minimum distance among distances from the two first sub-pixels and the two third sub-pixels corresponding to the same virtual quadrilateral to the surrounded second sub-pixel.

Optionally, vertical distances from edges of the two first sub-pixels corresponding to a same virtual quadrilateral that are close to the second sub-pixel to a center of the second sub-pixel are equal; and/or, vertical distances from edges of the two third sub-pixels corresponding to a same virtual quadrilateral that are close to the second sub-pixel to a center of the second sub-pixel are equal; and/or, vertical distances from edges of the two first sub-pixels corresponding to a same virtual quadrilateral that are close to the second sub-pixel to a center of the second sub-pixel are equal to vertical distances from edges of the two third sub-pixels corresponding to the same virtual quadrilateral that are close to the second sub-pixel to the center of the second sub-pixel.

Optionally, in at least one virtual quadrilateral, distances from a center of the second sub-pixel to the centers of the two third sub-pixels are not equal, and distances from the center of the second sub-pixel to the centers of the two first sub-pixels are equal; or, in at least one virtual quadrilateral, distances from a center of the second sub-pixel to the centers of the two third sub-pixels are equal, and distances from the center of the second sub-pixel to the centers of the two first sub-pixels are equal; or, in at least one virtual quadrilateral, distances from a center of the second sub-pixel to the centers of the two third sub-pixels are equal, and distances from the center of the second sub-pixel to the centers of the two first sub-pixels are not equal.

Optionally, each of the distances from the centers of the two first sub-pixels and the centers of the two third sub-pixels corresponding to a same virtual quadrilateral to a center of the second sub-pixel ranges from 20 μm to 60 μm.

Optionally, each of all interior angles of the virtual quadrilateral ranges from 70° to 120°.

Optionally, at least one virtual quadrilateral is a right-angled trapezoid, two interior angles of the at least one virtual quadrilateral are each 90°, one of the other two interior angles of the at least one virtual quadrilateral is an obtuse angle, and one of the other two interior angles of the at least one virtual quadrilateral is an acute angle.

Optionally, sixteen virtual quadrilaterals in an array form a virtual polygon, and the sixteen virtual quadrilaterals have the same arrangement of interior angles.

Optionally, four virtual quadrilaterals in an array form a virtual polygon including two types of virtual quadrilaterals, and two diagonal virtual quadrilaterals of the four virtual quadrilaterals have the same arrangement of interior angles.

Optionally, four virtual quadrilaterals in an array form a virtual polygon including three types of virtual quadrilaterals, and two diagonal virtual quadrilaterals of the four virtual quadrilaterals have the same arrangement of interior angles.

Optionally, the centers of the first sub-pixels in a same row are on a straight line parallel to a row direction, and/or the centers of the first sub-pixels in a same column are on a straight line parallel to a column direction.

Optionally, the centers of the third sub-pixels in a same row are on a straight line parallel to a row direction, and/or the centers of the third sub-pixels in a same column are on a straight line parallel to a column direction.

Optionally, connection lines of centers of four first sub-pixels surrounding each first sub-pixel form a square, the center of the first sub-pixel is at a center of the square, and two first sub-pixels on a diagonal of the square are symmetrical about the first sub-pixel at the center of the square.

Optionally, connection lines of centers of four third sub-pixels surrounding each third sub-pixel form a square, the center of the third sub-pixel is at a center of the square, and two third sub-pixels on a diagonal of the square are symmetrical about the third sub-pixel at the center of the square.

Optionally, diagonal third sub-pixels around each first sub-pixel are symmetrical about the center of the first sub-pixel.

Optionally, diagonal first sub-pixels around each third sub-pixel are symmetrical about the center of the third sub-pixel.

Optionally, diagonal third sub-pixels around each first sub-pixel have a same shape and a same position where a corner is cut off.

Optionally, diagonal first sub-pixels around each third sub-pixel have a same shape and a same position where a corner is cut off.

Optionally, a total opening area of the third sub-pixels, a total opening area of the second sub-pixels and a total opening area of the first sub-pixels decrease gradually, the total opening area of the first sub-pixel is x, the total opening area of the second sub-pixel is $2*a*x$, and the total opening area of the third sub-pixel is $b*x$, where $0.5 \leq a \leq 0.8$, and $1 < b \leq 2.2$.

Optionally, the first sub-pixel is a red sub-pixel, the second sub-pixel is a green sub-pixel, and the third sub-pixel is a blue sub-pixel.

In a second aspect, a display substrate is provided, including first sub-pixels, second sub-pixels and third sub-pixels; where, in a first direction, the first sub-pixels and the third sub-pixels are arranged alternately to form first sub-pixel rows, and the second sub-pixels form second sub-pixel rows; where in a second direction, the first sub-pixel rows and the second sub-pixel rows are arranged alternately, and the first direction is approximately perpendicular to the second direction; where two first sub-pixels and two third sub-pixels in two adjacent rows and two adjacent columns form a 2*2 array, in the 2*2 array, the two first sub-pixels are in different rows and in different columns, the two third sub-pixels are in different rows and in different columns, connection lines of centers of the two first sub-pixels and the two third sub-pixels form a virtual quadrilateral that is non-square, and a second sub-pixel is within the virtual quadrilateral; where four virtual quadrilaterals form a hexagon including two parallel edges, where: the four virtual quadrilaterals share one first sub-pixel, a first edge of the two parallel edges passes through a first sub-pixel, a third sub-pixel and another first sub-pixel, a second edge of the two parallel edges passes through a first sub-pixel, a third sub-pixel and another first sub-pixel, and a connection line of centers of two third sub-pixels on the two parallel edges does not pass through a center of the first sub-pixel shared by the four virtual quadrilaterals; or, the four virtual quadrilaterals share one third sub-pixel, a first edge of the two parallel edges passes through a third sub-pixel, a first sub-pixel and another third sub-pixel, a second edge of the two parallel edges passes through a third sub-pixel, a first sub-pixel and another third sub-pixel, and a connection line of centers of two first sub-pixels on the two parallel edges does not pass through a center of the third sub-pixel shared by the four virtual quadrilaterals.

Optionally, vertices or the two parallel edges of the hexagon pass through eight sub-pixels including four first sub-pixels and four third sub-pixels, and the first sub-pixels and the third sub-pixels in the eight sub-pixels are alternately arranged; where: a connection line of centers of two adjacent first sub-pixels in the eight sub-pixels is an edge of the two parallel edges of the hexagon, and a connection line of the center of one first sub-pixel of the two adjacent first sub-pixels and a center of another first sub-pixel adjacent to the one first sub-pixel does not pass through a center of the third sub-pixel between the one first sub-pixel and the another first sub-pixel; or a connection line of centers of two adjacent third sub-pixels in the eight sub-pixels is an edge of the two parallel edges of the hexagon, and a connection line of the center of one third sub-pixel of the two adjacent third sub-pixels and a center of another third sub-pixel adjacent to the one third sub-pixel does not pass through a center of the first sub-pixel between the one third sub-pixel and the another third sub-pixel.

Optionally, at least one sub-pixel of the two first sub-pixels and the two third sub-pixels corresponding to the virtual quadrilateral is a pattern where a corner is cut off.

Optionally, the at least one sub-pixel of the two first sub-pixels and the two third sub-pixels has a shape of a square where a corner is cut off.

Optionally, for the two first sub-pixels corresponding to a same virtual quadrilateral, positions where corners are cut off are the same or different; or, for the two third sub-pixels corresponding to a same virtual quadrilateral, positions where corners are cut off are the same or different.

Optionally, vertical distances from edges of the two first sub-pixels corresponding to a same virtual quadrilateral that are close to the second sub-pixel to a center of the second sub-pixel are equal; and/or, vertical distances from edges of the two third sub-pixels corresponding to a same virtual quadrilateral that are close to the second sub-pixel to a center of the second sub-pixel are equal; and/or, vertical distances from edges of the two first sub-pixels corresponding to a same virtual quadrilateral that are close to the second sub-pixel to a center of the second sub-pixel are equal to vertical distances from edges of the two third sub-pixels corresponding to the same virtual quadrilateral that are close to the second sub-pixel to the center of the second sub-pixel.

Optionally, each of all interior angles of the virtual quadrilateral ranges from 70° to 120°.

Optionally, at least one virtual quadrilateral is a right-angled trapezoid, two interior angles of the at least one virtual quadrilateral are each 90°, one of the other two interior angles of the at least one virtual quadrilateral is an obtuse angle, and one of the other two interior angles of the at least one virtual quadrilateral is an acute angle.

Optionally, sixteen virtual quadrilaterals in an array form a virtual polygon, and the sixteen virtual quadrilaterals have the same arrangement of interior angles.

Optionally, four virtual quadrilaterals in an array form a virtual polygon including two types of virtual quadrilaterals, and two diagonal virtual quadrilaterals of the four virtual quadrilaterals have the same arrangement of interior angles.

Optionally, four virtual quadrilaterals in an array form a virtual polygon including three types of virtual quadrilaterals, and two diagonal virtual quadrilaterals of the four virtual quadrilaterals have the same arrangement of interior angles.

In a third aspect, a display device is provided, including the display substrate in the first aspect, or the display substrate in the second aspect.

Optionally, the display device further includes a pixel defining layer, where the pixel defining layer includes multiple pixel defining layer openings, each of the first sub-pixels, the second sub-pixels and the third sub-pixels corresponds to a pixel defining layer opening of the multiple pixel defining layer openings, and shapes of the first sub-pixel, the second sub-pixel and the third sub-pixel are approximately the same as shapes of their respective pixel defining layer openings.

Optionally, the first sub-pixel includes multiple films, and the multiple films of the first sub-pixel at least partially covers a region outside the corresponding pixel defining layer opening; and/or, the second sub-pixel includes multiple films, and the multiple films of the second sub-pixel at least partially covers a region outside the corresponding pixel defining layer opening; and/or, the third sub-pixel includes multiple films, and the multiple films of the third sub-pixel at least partially covers a region outside the corresponding pixel defining layer opening.

Optionally, at least some of the multiple pixel defining layer openings have different shapes and/or different areas.

Optionally, at least some of the pixel defining layer openings corresponding to the first sub-pixels or the third sub-pixels have different shapes and/or different areas.

In a fourth aspect, a high-precision metal mask for manufacturing the display substrate in the first aspect, or the display substrate in the second aspect is provided. The first sub-pixel includes multiple films, the second sub-pixel includes multiple films, the third sub-pixel includes multiple films, the high-precision metal mask includes multiple opening regions, and the multiple opening regions includes: a first opening region corresponding to a shape and a distribution of at least one film in the first sub-pixel, or a second opening region corresponding to a shape and a distribution of at least one film in the second sub-pixel, or a third opening region corresponding to a shape and a distribution of at least one film in the third sub-pixel.

The beneficial effects of the above technical solutions of the present disclosure are as follows.

In the embodiments of the present disclosure, on the one hand, by sharing sub-pixels, higher resolution can be achieved; on the other hand, the first sub-pixel and/or the third sub-pixel is set to be a pattern where a corner is cut off, in this way, the center of the first sub-pixel and/or the center of the third sub-pixel is shifted, so that brightness centers of virtual pixels are arranged more uniformly, avoiding graininess and distortion of the display and improving display effect; in addition, without the need of moving positions of the sub-pixels, the brightness centers of the virtual pixels are moved, which has a low implementation cost.

DETAILED DESCRIPTION

To make objectives, technical solutions, and advantages of embodiments of the present disclosure clearer, the technical solutions of the embodiments of the present disclosure will be clearly and completely described hereinafter with reference to the accompanying drawings of the embodiments of the present disclosure. The described embodiments are a part rather than all of the embodiments of the present disclosure. Based on the described embodiments of the present disclosure, all other embodiments obtained by those skilled in the art fall within the protection scope of the present disclosure.

Figure 1:
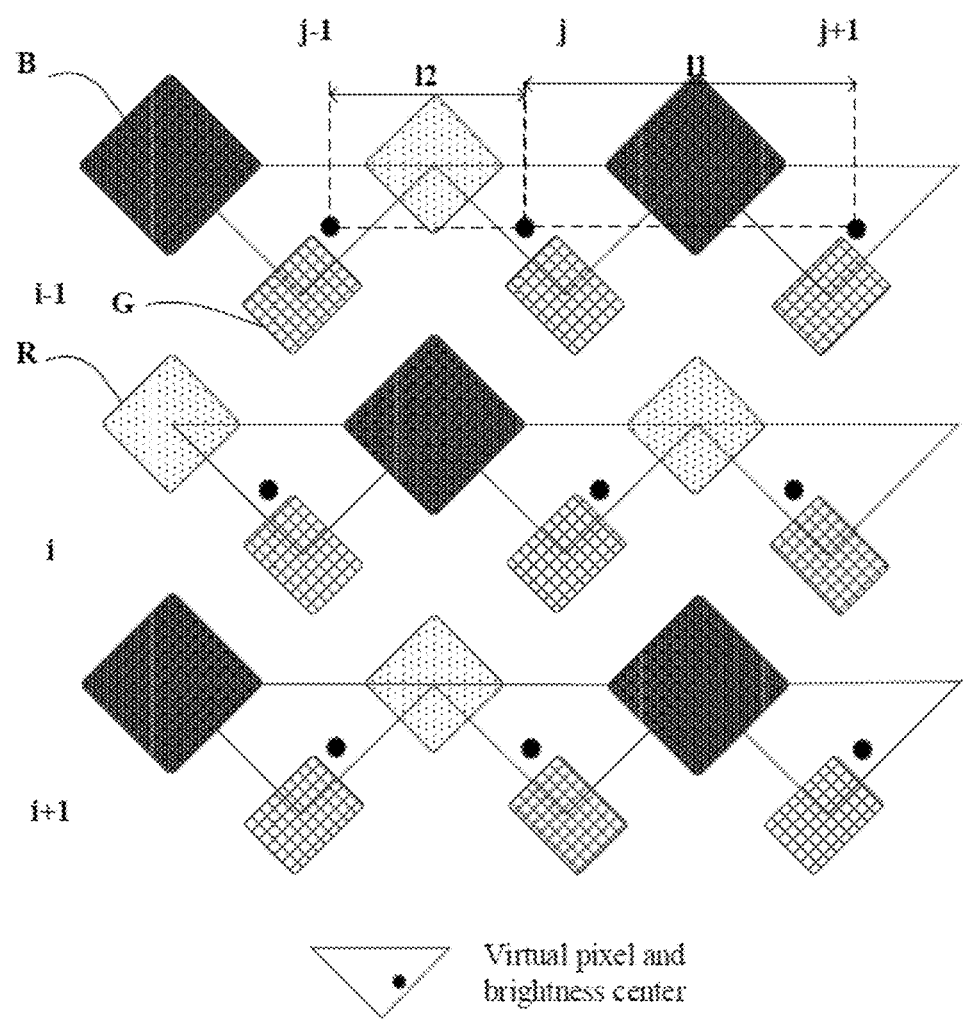
FIG. 1 is a schematic diagram of a pixel arrangement structure in the related technologies.

Reference is made to FIG. 1. FIG. 1 is a schematic diagram of a pixel arrangement structure in the related technologies. In FIG. 1, blue sub-pixels (B) and red sub-pixels (R) each are a square (or a square with rounded corners). In this structure, in the (i−1)-th row, a distance 11 between brightness centers (the black dots in the figure) of a virtual pixel (a triangle in the figure) in the j-th column and a virtual pixel in the (j+1)-th column is greater than a distance 12 between brightness centers of the virtual pixel in the j-th column and a virtual pixel in the (j−1)-th column; in the i-th row, a distance between brightness centers of the virtual pixel in a j-th column and a virtual pixel in the (j+1)-th column (the black dots in the figure) is smaller than a distance between brightness centers of the virtual pixel in the j-th column and a virtual pixel in the (j−1)-th column; which results in a perceptible sense of distortion and graininess to human eyes when vertical lines or an image dominated by vertical lines are displayed.

Figure 2:
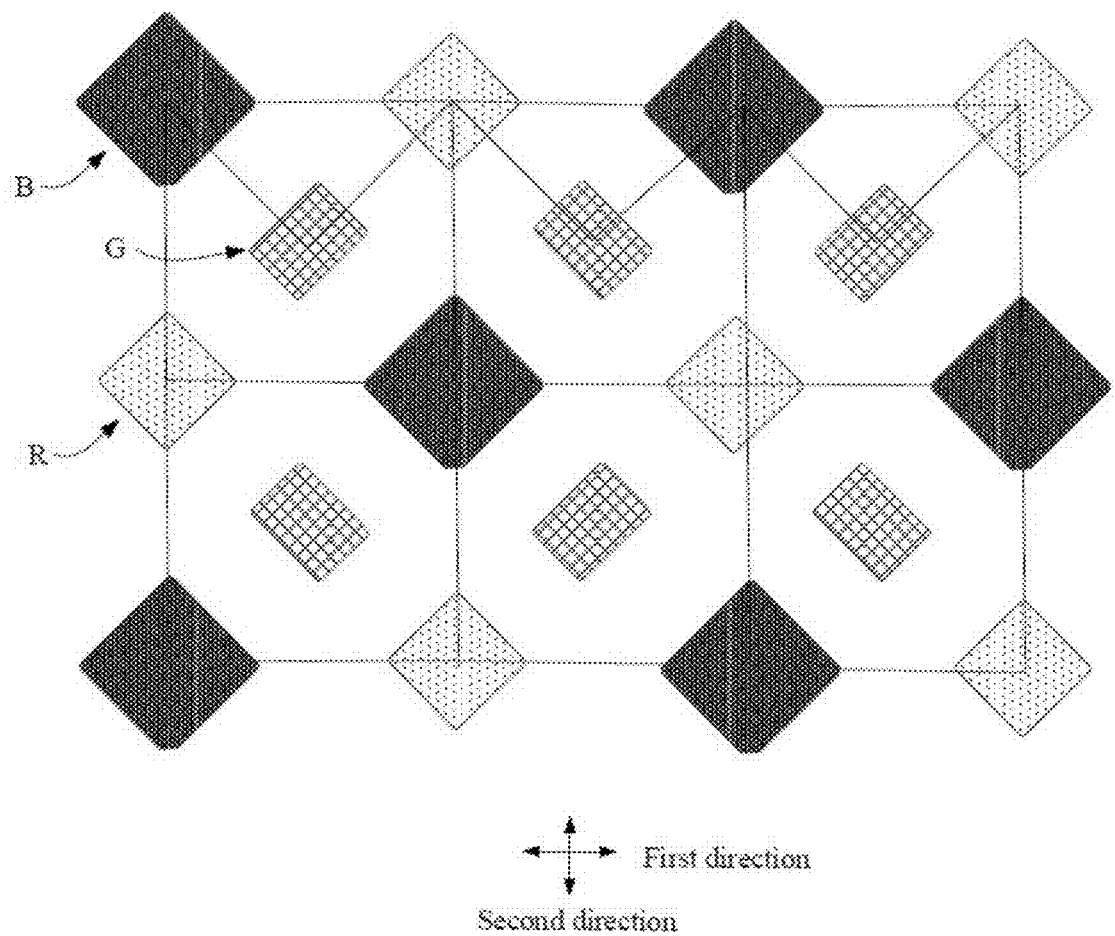
FIG. 2 and FIG. 3 are each a schematic diagram of a display substrate according to embodiments of the present disclosure.

In order to solve the above problem, as shown in FIG. 2, embodiments of the present disclosure provide a display substrate, including: first sub-pixels R, second sub-pixels G, and third sub-pixels B. In a first direction, the first sub-pixels R and the third sub-pixels B are alternately arranged to form first sub-pixel rows, and the second sub-pixels G form second sub-pixel rows. In a second direction, the first sub-pixel rows and the second sub-pixel rows are alternately arranged, and the first direction and the second direction are perpendicular or substantially perpendicular. Two first sub-pixels R and two third sub-pixels B distributed in two adjacent rows and two adjacent columns form a 2*2 array. In the 2*2 array, the two first sub-pixels R are located in different rows and in different columns, the two third sub-pixels B are located in different rows and in different columns, at least one sub-pixel of the two first sub-pixels and the two third sub-pixels is a pattern where a corner is cut off, connection lines of centers of the two first sub-pixels R and the two third sub-pixels B form a virtual quadrilateral that is non-square, and the sub-pixel G is located within the virtual quadrilateral.

In the embodiments shown in FIG. 2, the two third sub-pixels B in the virtual quadrilateral each have a shape of a square where a corner is cut off. Or, each sub-pixel may be of a rectangular shape, an elliptical shape or other shapes.

It can be seen from FIG. 2 that, the first sub-pixel R and third sub-pixel B which are adjacent and are in a same row, and a second sub-pixel G in the next row, form a virtual pixel (the triangle in the figure). Moreover, adjacent virtual pixels in a same row share a first sub-pixel R or a third sub-pixel B.

In the embodiments of the present disclosure, the first sub-pixel and/or the third sub-pixel is set to be a pattern where a corner is cut off, in this way, the center of the first sub-pixel and/or the center of the third sub-pixel is shifted, so that a difference of distances each of which is between brightness centers of adjacent virtual pixels in a same row is smaller than a difference of distances each of which is between brightness centers of adjacent virtual pixels in a same row in the related technologies. That is, the arrangement of the brightness centers of the virtual pixels in the embodiments of the present disclosure is more uniform.

In the embodiments of the present disclosure, on the one hand, by sharing sub-pixels, higher resolution can be achieved; on the other hand, the first sub-pixel and/or the third sub-pixel is set to be a pattern where a corner is cut off, in this way, the center of the first sub-pixel and/or the center of the third sub-pixel is shifted, so that brightness centers of virtual pixels are arranged more uniformly, avoiding graininess and distortion of the display and improving display effect; in addition, without the need of moving positions of the sub-pixels, the brightness centers of the virtual pixels are moved, which has a low implementation cost.

In the embodiments shown in FIG. 2, each third sub-pixel B has a shape of a square where a corner is cut off. In some other embodiments of the present disclosure, some of the third sub-pixels B may each have a shape of a square where a corner is cut off. In addition, different third sub-pixels B in which corners are cut off may have the same or different positions where corners are cut off.

In some other embodiments, the third sub-pixel B may have a shape of a square where two corners are cut off or have a shape of a square where three corners are cut off.

In some other embodiments, some or all of the first sub-pixels R may each have a shape of a square where a corner is cut off, a shape of a square where two corners are cut off or a shape of a square where three corners are cut off. Different first sub-pixels R in which corners are cut off may have the same or different positions where corners are cut off.

In the embodiments of the present disclosure, optionally, the two first sub-pixels R and the two third sub-pixels B corresponding to a same virtual quadrilateral surround a second sub-pixel G, and a minimum distance among distances from other first sub-pixels R and other third sub-pixels B outside the same virtual quadrilateral to the surrounded second sub-pixel G is greater than a minimum distance among distances from the two first sub-pixels R and the two third sub-pixels B corresponding to the same virtual quadrilateral to the surrounded second sub-pixel G. The distance may be a distance between boundaries of sub-pixels. In addition, if patterns of the sub-pixels have rounded corners, the distance between the rounded corners may be partially deviated. Therefore, the error caused by the rounded corners, or the measurement error, needs to be considered for the distance, for example, in a case of a deviation of about 3 microns, it is regarded as equivalent.

In the embodiments of the present disclosure, optionally, within the virtual quadrilateral, the second sub-pixel G is symmetrical with respect to a connection line of centers of two diagonal third sub-pixels B, or symmetrical with respect to a connection line of centers of two diagonal first sub-pixels R. In the embodiments shown in FIG. 2, the second sub-pixel G is symmetrical with respect to a connection line of centers of two diagonal first sub-pixels R.

Figure 3:
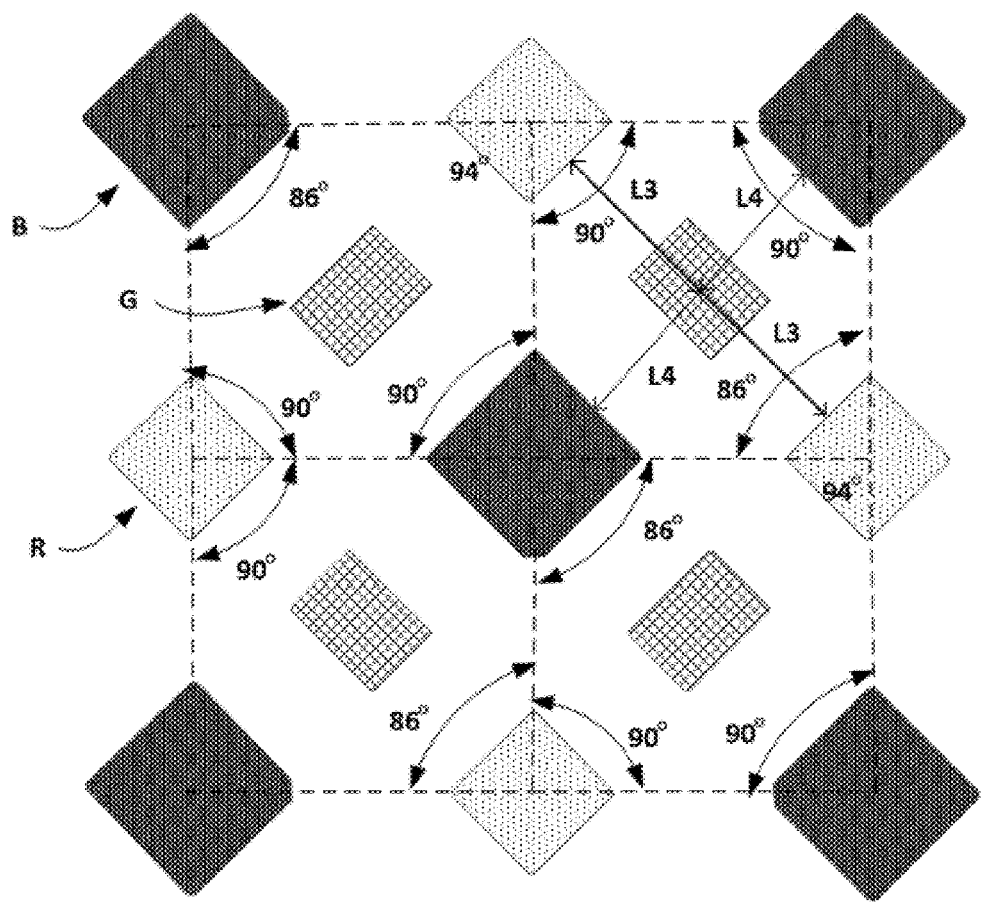

In the embodiments of the present disclosure, optionally, referring to FIG. 3, vertical distances L3 from edges of the two first sub-pixels R corresponding to a same virtual quadrilateral that are close to the second sub-pixel G to a center of the second sub-pixel G are equal; and/or, vertical distances L4 from edges of the two third sub-pixels B corresponding to a same virtual quadrilateral that are close to the second sub-pixel G to a center of the second sub-pixel G are equal; and/or, vertical distances L3 from edges of the two first sub-pixels R corresponding to a same virtual quadrilateral that are close to the second sub-pixel G to a center of the second sub-pixel G are equal to vertical distances L4 from edges of the two third sub-pixels B corresponding to the same virtual quadrilateral that are close to the second sub-pixel G to the center of the second sub-pixel G.

In the embodiments of the present disclosure, optionally, in at least one virtual quadrilateral, distances from a center of the second sub-pixel G to the centers of the two third sub-pixels B are not equal, and distances from the center of the second sub-pixel G to the centers of the two first sub-pixels R are equal. In the embodiments, the third sub-pixels B each are a sub-pixel where a corner is cut off, so that positions of centers of them are changed.

Or, in at least one virtual quadrilateral, distances from a center of the second sub-pixel G to the centers of the two third sub-pixels B are equal, and distances from the center of the second sub-pixel G to the centers of the two first sub-pixels R are equal.

Or, in at least one virtual quadrilateral, distances from a center of the second sub-pixel G to the centers of the two third sub-pixels B are equal, and distances from the center of the second sub-pixel G to the centers of the two first sub-pixels B are not equal. In the embodiments, the first sub-pixels R each are a sub-pixel where a corner is cut off, so that positions of centers of them are changed.

In the embodiments of the present disclosure, optionally, each of the distances from the centers of the two first sub-pixels R and the centers of the two third sub-pixels B corresponding to a same virtual quadrilateral to a center of the second sub-pixel G ranges from 20 μm to 60 μm. Further, optionally, each of the distances from the centers of the two first sub-pixels R and the centers of the two third sub-pixels B corresponding to a same virtual quadrilateral to the center of the second sub-pixel G ranges from 25 to 50 μm, or, 30 to 48 μm, such as 30 μm, 32 μm, 35 μm or 37 μm, etc.

In the embodiments of the present disclosure, optionally, if the distances from the center of the second sub-pixel G to the centers of the two third sub-pixels B corresponding to a same virtual are equal, and distances from the center of the second sub-pixel G to the centers of the two first sub-pixels R corresponding to the same virtual are equal, then, for the multiple distances that are from the centers of the two first sub-pixels R and the centers of the two third sub-pixels B corresponding to the same virtual quadrilateral to the center of the second sub-pixel G, a ratio of any two distances among the multiple distances is in a range of 0.7 to 1.3.

In the embodiments of the present disclosure, optionally, the centers of the first sub-pixels R in a same row are on a straight line parallel to a row direction, and/or the centers of the first sub-pixels R in a same column are on a straight line parallel to a column direction.

In the embodiments of the present disclosure, optionally, the centers of the third sub-pixels B in a same row are on a straight line parallel to a row direction, and/or the centers of the third sub-pixels B in a same column are on a straight line parallel to a column direction.

In the embodiments of the present disclosure, optionally, a range of each of all interior angles of the virtual quadrilateral is 70° to 120°. Further, optionally, the interior angles of the virtual quadrilateral include at least one obtuse angle or at least one acute angle.

In the embodiments of the present disclosure, optionally, reference is made to FIG. 3. At least one virtual quadrilateral is a right-angled trapezoid, two interior angles thereof each are 90°, and one of the other two interior angles thereof is an obtuse angle which is X°, and one of the other two interior angles thereof is an acute angle which is Y°. The range of obtuse angle is greater than 90° and less than or equal to 100°, further optionally, being 91°-96°. The range of acute angle is greater than or equal to 80° and less than 90°, and further optionally, being 84°-89°. In the embodiments shown in FIG. 3, the acute angle is 86° and the obtuse angle is 94°.

Figure 4:
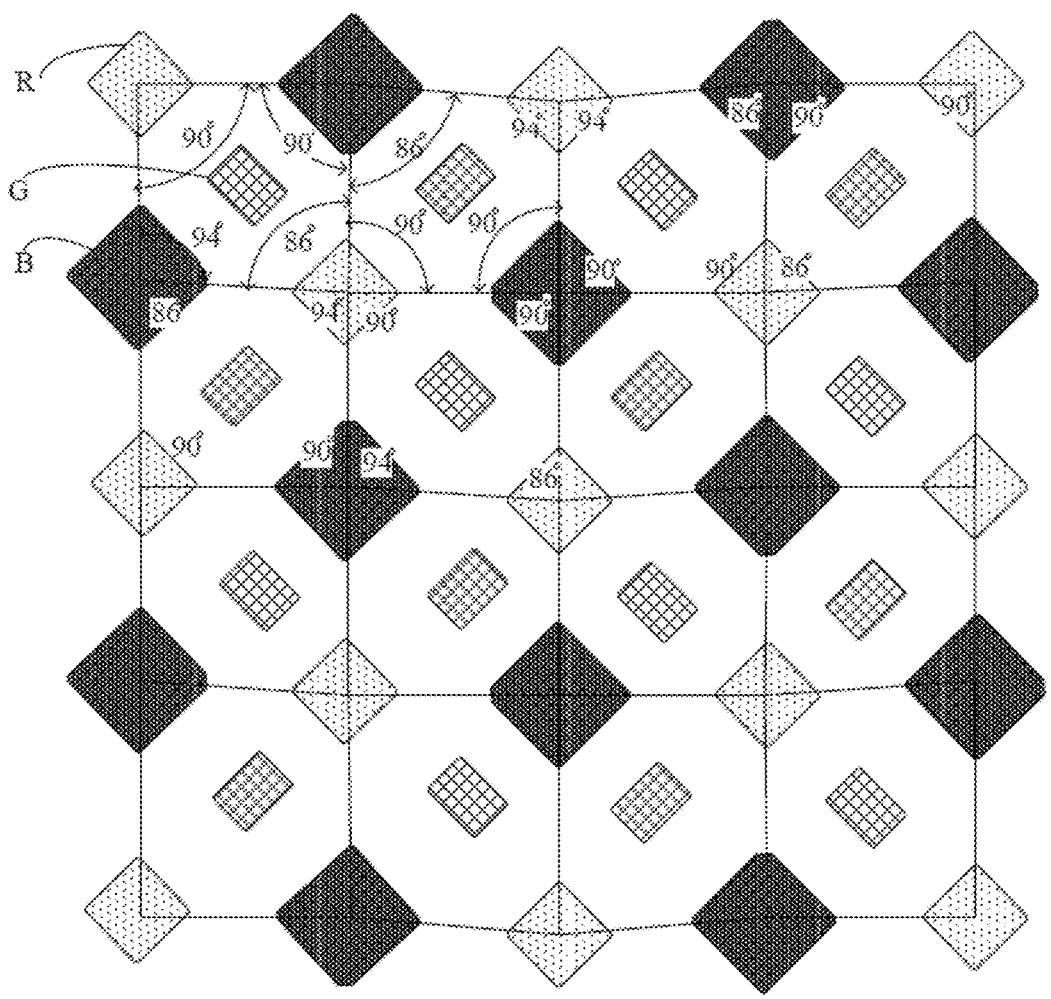
FIG. 4 is a schematic diagram of a display substrate according to an embodiment of the present disclosure.

In the embodiments of the present disclosure, optionally, referring to FIG. 4, sixteen virtual quadrilaterals arranged in an array form a virtual polygon, centers of the first sub-pixels R and the third sub-pixels B are located at vertices or edges of the virtual polygon, the first sub-pixels R and the third sub-pixels B are alternately arranged clockwise, and one of the first sub-pixels R is located at the center of the virtual polygon. The sixteen virtual quadrilaterals have the same arrangement of interior angles. Two diagonal third sub-pixels B around each first sub-pixel R are symmetrical about a center of the first sub-pixel R.

Figure 5:
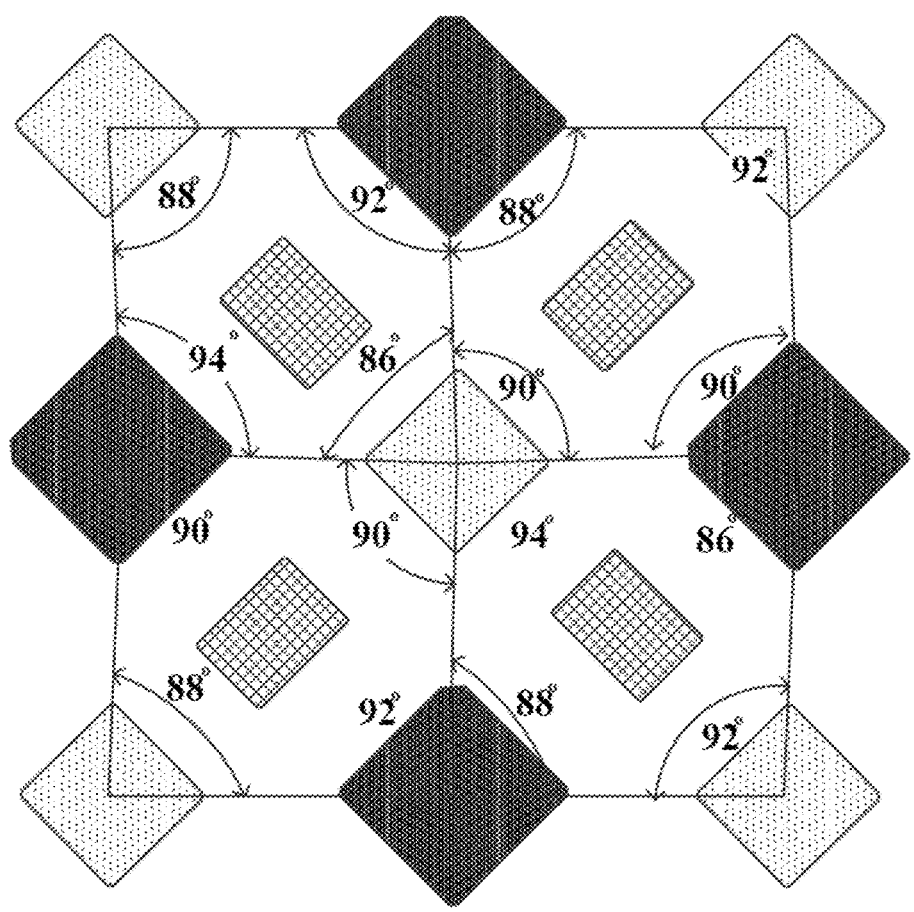
FIG. 5 is a schematic diagram of a display substrate according to an embodiment of the present disclosure.

In the embodiments of the present disclosure, optionally, referring to FIG. 5, four virtual quadrilaterals arranged in an array form a virtual polygon, centers of four first sub-pixels R and four third sub-pixels B are located at vertices or edges of the virtual polygon, the first sub-pixels R and the third sub-pixels B are alternately arranged clockwise, and one of the first sub-pixels R is located at the center of the virtual polygon. The virtual polygon includes two types of virtual quadrilaterals, two diagonal virtual quadrilaterals have the same arrangement of interior angles, and two diagonal third sub-pixels around each first sub-pixel R have a same shape and a same direction in which a corner is cut off.

Figure 6:
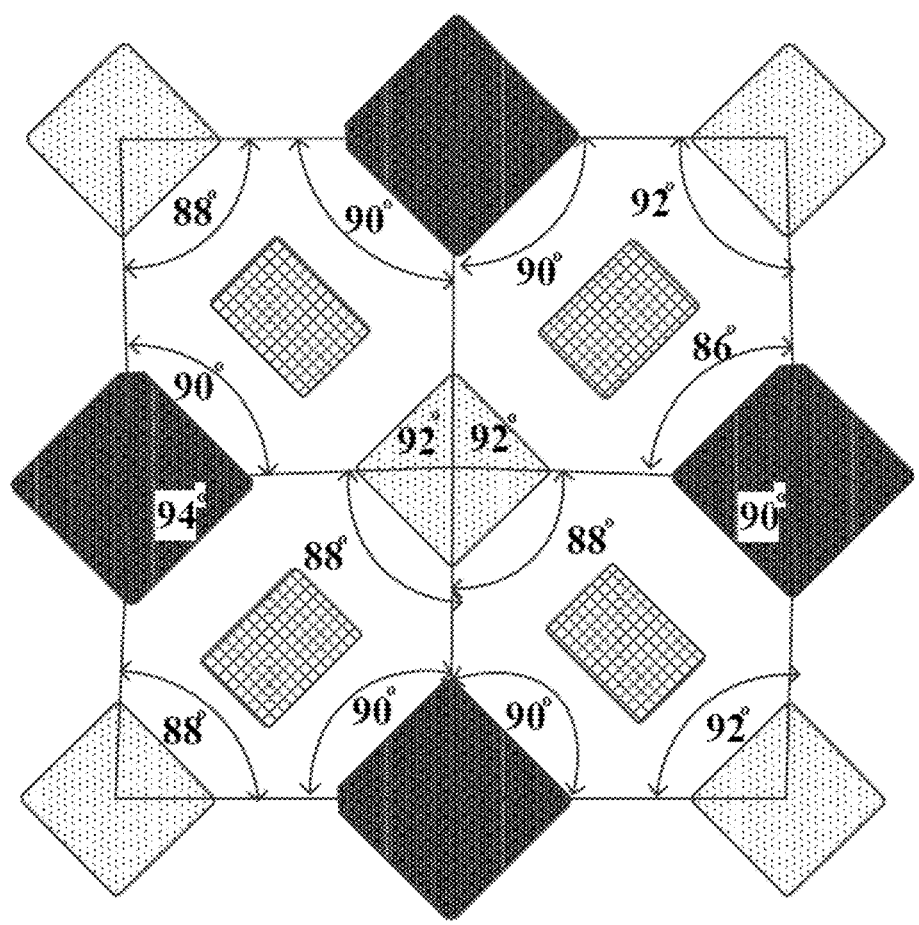
FIG. 6 is a schematic diagram of a display substrate according to an embodiment of the present disclosure.

In the embodiments of the present disclosure, optionally, referring to FIG. 6, four virtual quadrilaterals arranged in an array form a virtual polygon, centers of four first sub-pixels R and four third sub-pixels B are located at vertices or edges of the virtual polygon, the first sub-pixels R and the third sub-pixels B are alternately arranged clockwise, and one of the first sub-pixels R is located at the center of the virtual polygon. The virtual polygon includes three types of virtual quadrilaterals, one pair of diagonal virtual quadrilaterals have the same arrangement of interior angles, and two diagonal third sub-pixels around each first sub-pixel R have a same shape and a same direction in which a corner is cut off.

In the embodiments of the present disclosure, optionally, connection lines of centers of four first sub-pixels R surrounding each first sub-pixel R form a square, the center of the first sub-pixel R is at a center of the square, and two first sub-pixels R on a diagonal of the square are symmetrical about the first sub-pixel R at the center of the square.

In the embodiments of the present disclosure, optionally, connection lines of centers of four third sub-pixels B surrounding each third sub-pixel B form a square, the center of the third sub-pixel B is at a center of the square, and two third sub-pixels B on a diagonal of the square are symmetrical about the third sub-pixel B at the center of the square.

In the embodiments of the present disclosure, optionally, four third sub-pixels B surrounding each first sub-pixel R are symmetrical about a center of the first sub-pixel R.

In the embodiments of the present disclosure, optionally, four first sub-pixels R surrounding each third sub-pixel B are symmetrical about a center of the third sub-pixel B.

The human eyes have different capabilities for differentiating the first sub-pixel R, the second sub-pixel G, and the third sub-pixel B. The brightness effects of the three kinds of sub-pixels are also different. The second sub-pixel G has the largest brightness effect, followed by the first sub-pixel R, and the third sub-pixel B has the smallest brightness effect. In addition, for organic light-emitting materials of different colors, their corresponding devices have different lives. Therefore, optionally, the total opening areas of the sub-pixels are as follows: the total opening area of third sub-pixels B>the total opening area of second sub-pixels G>the total opening area of the first sub-pixels R. That is, the total opening area of the third sub-pixels B, the total opening area of the second sub-pixels G, and the total opening area of the first sub-pixels R decrease sequentially, the total opening area of the first sub-pixels R is x, the total opening area of the second sub-pixels G is $2*a*x$, and the total opening area of the third sub-pixels B is $b*x$, where $0.5 \leq a \leq 0.8$ and $1 \leq b \leq 2.2$.

In the embodiments of the present disclosure, a total opening area of sub-pixels refers to a total light-emitting area of the sub-pixels on the entire panel.

In the above embodiments of the present disclosure, a case where the shapes of the first sub-pixel, the second sub-pixel, and the third sub-pixel are all quadrilaterals with rounded corners is taken as an example. In some embodiments, optionally, the shapes of the first sub-pixel, the second sub-pixel, and the third sub-pixel may be other polygons; or, the shapes of the first sub-pixel, the second sub-pixel, and the third sub-pixel may be any of: other types of polygons with rounded corners, circle, or ellipse.

In the above embodiments of the present disclosure, a case where the first sub-pixel is a red sub-pixel (R), the second sub-pixel is a green sub-pixel (G), and the third sub-pixel is a blue sub-pixel (B) is taken as an example, and the present disclosure does not exclude the use of sub-pixels of other colors.

In the above embodiments of the present disclosure, the ratio of the numbers of the first sub-pixels, the second sub-pixels, and the third sub-pixels is 1:2:1, so as to realize the sharing of sub-pixels and improve the resolution.

It should be appreciated that, specific shapes of the sub-pixels and positional relationships among the sub-pixels may be designed as required. In a practical process, due to limitations of process conditions or other factors, there may be some deviations. Therefore, the shapes and the positions of the sub-pixels and the relative positional relationships among the sub-pixels may meet the above conditions approximately, which are also included in the pixel arrangement structure of the embodiments of the present disclosure.

A display substrate is further provided according to embodiments of the present disclosure, including first sub-pixels, second sub-pixels and third sub-pixels; where, in a first direction, the first sub-pixels and the third sub-pixels are arranged alternately to form first sub-pixel rows, and the second sub-pixels form second sub-pixel rows; where in a second direction, the first sub-pixel rows and the second sub-pixel rows are arranged alternately, and the first direction is approximately perpendicular to the second direction; where two first sub-pixels and two third sub-pixels in two adjacent rows and two adjacent columns form a 2*2 array, in the 2*2 array, the two first sub-pixels are in different rows and in different columns, the two third sub-pixels are in different rows and in different columns, connection lines of centers of the two first sub-pixels and the two third sub-pixels form a virtual quadrilateral that is non-square, and a second sub-pixel is within the virtual quadrilateral; where four virtual quadrilaterals form a hexagon including two parallel edges, where: the four virtual quadrilaterals share one first sub-pixel, a first edge of the two parallel edges passes through a first sub-pixel, a third sub-pixel and another first sub-pixel, a second edge of the two parallel edges passes through a first sub-pixel, a third sub-pixel and another first sub-pixel, and a connection line of centers of two third sub-pixels on the two parallel edges does not pass through a center of the first sub-pixel shared by the four virtual quadrilaterals; or, the four virtual quadrilaterals share one third sub-pixel, a first edge of the two parallel edges passes through a third sub-pixel, a first sub-pixel and another third sub-pixel, a second edge of the two parallel edges passes through a third sub-pixel, a first sub-pixel and another third sub-pixel, and a connection line of centers of two first sub-pixels on the two parallel edges does not pass through a center of the third sub-pixel shared by the four virtual quadrilaterals.

In the embodiments of the present disclosure, the connection lines of the centers of the two first sub-pixels and the two third sub-pixels in two adjacent rows and two adjacent columns form the non-square virtual quadrilateral, and four virtual quadrilaterals form the hexagon, so that a difference of distances each of which is between brightness centers of adjacent virtual pixels in a same row is smaller than a difference of distances each of which is between brightness centers of adjacent virtual pixels in a same row in the related technologies. That is, the arrangement of the brightness centers of the virtual pixels in the embodiments of the present disclosure is more uniform.

In the embodiments of the present disclosure, on the one hand, by sharing sub-pixels, higher resolution can be achieved; on the other hand, brightness centers of virtual pixels are arranged more uniformly, avoiding graininess and distortion of the display and improving display effect.

In the embodiments of the present disclosure, referring to FIG. 3 to FIG. 6, optionally, vertices or parallel edges of the hexagon pass through eight sub-pixels including four first sub-pixels R and four third sub-pixels B, and the first sub-pixels R and the third sub-pixels B in the eight sub-pixels are alternately arranged.

Referring to FIG. 5, a connection line of centers of two adjacent first sub-pixels R in the eight sub-pixels is an edge of the two parallel edges of the hexagon, and a connection line of the center of one first sub-pixel R of the two adjacent first sub-pixels R and a center of another first sub-pixel R adjacent to the one first sub-pixel R does not pass through a center of the third sub-pixel B between the one first sub-pixel R and the another first sub-pixel R.

Or, referring to FIG. 3, a connection line of centers of two adjacent third sub-pixels B in the eight sub-pixels is an edge of the two parallel edges of the hexagon, and a connection line of the center of one third sub-pixel B of the two adjacent third sub-pixels B and a center of another third sub-pixel B adjacent to the one third sub-pixel B does not pass through a center of the first sub-pixel R between the one third sub-pixel B and the another third sub-pixel B.

In the embodiments of the present disclosure, optionally, at least one sub-pixel of the two first sub-pixels and the two third sub-pixels corresponding to the virtual quadrilateral is a pattern where a corner is cut off.

In the embodiments of the present disclosure, optionally, the at least one sub-pixel of the two first sub-pixels and the two third sub-pixels has a shape of a square where a corner is cut off.

In the embodiments of the present disclosure, optionally, the at least one sub-pixel of the two first sub-pixels and the two third sub-pixels is a pattern where one corner is cut off, a pattern where two corners are cut off or a pattern where three corners are cut off.

In the embodiments of the present disclosure, optionally, the two first sub-pixels and the two third sub-pixels corresponding to a same virtual quadrilateral surround a second sub-pixel, and a minimum distance among distances from other first sub-pixels and other third sub-pixels outside the same virtual quadrilateral to the surrounded second sub-pixel is greater than a minimum distance among distances from the two first sub-pixels and the two third sub-pixels corresponding to the same virtual quadrilateral to the surrounded second sub-pixel.

In the embodiments of the present disclosure, optionally, for the two first sub-pixels corresponding to a same virtual quadrilateral, positions where corners are cut off are the same or different; or, for the two third sub-pixels corresponding to a same virtual quadrilateral, positions where corners are cut off are the same or different.

In the embodiments of the present disclosure, optionally, vertical distances from edges of the two first sub-pixels corresponding to a same virtual quadrilateral that are close to the second sub-pixel to a center of the second sub-pixel are equal; and/or, vertical distances from edges of the two third sub-pixels corresponding to a same virtual quadrilateral that are close to the second sub-pixel to a center of the second sub-pixel are equal; and/or, vertical distances from edges of the two first sub-pixels corresponding to a same virtual quadrilateral that are close to the second sub-pixel to a center of the second sub-pixel are equal to vertical distances from edges of the two third sub-pixels corresponding to the same virtual quadrilateral that are close to the second sub-pixel to the center of the second sub-pixel.

In the embodiments of the present disclosure, optionally, in at least one virtual quadrilateral, distances from a center of the second sub-pixel to the centers of the two third sub-pixels are not equal, and distances from the center of the second sub-pixel to the centers of the two first sub-pixels are equal; or, in at least one virtual quadrilateral, distances from a center of the second sub-pixel to the centers of the two third sub-pixels are equal, and distances from the center of the second sub-pixel to the centers of the two first sub-pixels are equal; or, in at least one virtual quadrilateral, distances from a center of the second sub-pixel to the centers of the two third sub-pixels are equal, and distances from the center of the second sub-pixel to the centers of the two first sub-pixels are not equal.

In the embodiments of the present disclosure, optionally, each of the distances from the centers of the two first sub-pixels and the centers of the two third sub-pixels corresponding to a same virtual quadrilateral to a center of the second sub-pixel ranges from 20 μm to 60 μm.

In the embodiments of the present disclosure, optionally, each of all interior angles of the virtual quadrilateral ranges from 70° to 120°.

In the embodiments of the present disclosure, optionally, at least one virtual quadrilateral is a right-angled trapezoid, two interior angles of the at least one virtual quadrilateral are each 90°, one of the other two interior angles of the at least one virtual quadrilateral is an obtuse angle, and one of the other two interior angles of the at least one virtual quadrilateral is an acute angle.

In the embodiments of the present disclosure, optionally, referring to FIG. 4, sixteen virtual quadrilaterals in an array form a virtual polygon, and the sixteen virtual quadrilaterals have the same arrangement of interior angles.

In the embodiments of the present disclosure, optionally, referring to FIG. 5, four virtual quadrilaterals in an array form a virtual polygon including two types of virtual quadrilaterals, and two diagonal virtual quadrilaterals of the four virtual quadrilaterals have the same arrangement of interior angles.

In the embodiments of the present disclosure, optionally, referring to FIG. 6, four virtual quadrilaterals in an array form a virtual polygon including three types of virtual quadrilaterals, and two diagonal virtual quadrilaterals of the four virtual quadrilaterals have the same arrangement of interior angles.

In the embodiments of the present disclosure, optionally, the centers of the first sub-pixels in a same row are on a straight line parallel to a row direction, and/or the centers of the first sub-pixels in a same column are on a straight line parallel to a column direction.

In the embodiments of the present disclosure, optionally, the centers of the third sub-pixels in a same row are on a straight line parallel to a row direction, and/or the centers of the third sub-pixels in a same column are on a straight line parallel to a column direction.

In the embodiments of the present disclosure, optionally, connection lines of centers of four first sub-pixels surrounding each first sub-pixel form a square, the center of the first sub-pixel is at a center of the square, and two first sub-pixels on a diagonal of the square are symmetrical about the first sub-pixel at the center of the square.

In the embodiments of the present disclosure, optionally, connection lines of centers of four third sub-pixels surrounding each third sub-pixel form a square, the center of the third sub-pixel is at a center of the square, and two third sub-pixels on a diagonal of the square are symmetrical about the third sub-pixel at the center of the square.

In the embodiments of the present disclosure, optionally, diagonal third sub-pixels around each first sub-pixel are symmetrical about the center of the first sub-pixel.

In the embodiments of the present disclosure, optionally, diagonal first sub-pixels around each third sub-pixel are symmetrical about the center of the third sub-pixel.

In the embodiments of the present disclosure, optionally, diagonal third sub-pixels around each first sub-pixel have a same shape and a same position where a corner is cut off.

In the embodiments of the present disclosure, optionally, diagonal first sub-pixels around each third sub-pixel have a same shape and a same position where a corner is cut off.

In the embodiments of the present disclosure, optionally, a total opening area of the third sub-pixels, a total opening area of the second sub-pixels and a total opening area of the first sub-pixels decrease gradually, the total opening area of the first sub-pixel is x, the total opening area of the second sub-pixel is $2*a*x$, and the total opening area of the third sub-pixel is $b*x$, where $0.5 \leq a \leq 0.8$, and $1 < b \leq 2.2$.

In the embodiments of the present disclosure, optionally, the first sub-pixel is a red sub-pixel, the second sub-pixel is a green sub-pixel, and the third sub-pixel is a blue sub-pixel.

In the above embodiments of the present disclosure, a case where the first sub-pixel is a red sub-pixel (R), the second sub-pixel is a green sub-pixel (G), and the third sub-pixel is a blue sub-pixel (B) is taken as an example, and the present disclosure does not exclude the use of sub-pixels of other colors.

In the above embodiments of the present disclosure, the ratio of the numbers of the first sub-pixels, the second sub-pixels, and the third sub-pixels is 1:2:1, so as to realize the sharing of sub-pixels and improve the resolution.

Embodiments of the present disclosure also provide a display device, including the above display substrate.

In embodiments of the present disclosure, optionally, the display device further includes a pixel defining layer, the pixel defining layer includes multiple pixel defining layer openings, each of the first sub-pixels, the second sub-pixels and the third sub-pixels corresponds to a pixel defining layer opening of the multiple pixel defining layer openings, and shapes of the first sub-pixel, the second sub-pixel and the third sub-pixel are approximately the same as shapes of their respective pixel defining layer openings.

In the embodiments of the present disclosure, optionally, the first sub-pixel includes multiple films, and the multiple films of the first sub-pixel at least partially cover a region outside the pixel defining layer opening; and/or, the second sub-pixel includes multiple films, and the multiple films of the second sub-pixel at least partially cover a region outside the pixel defining layer opening; and/or, the third sub-pixel includes multiple films, and the multiple films of the third sub-pixel at least partially cover a region outside the pixel defining layer opening.

In the embodiments of the present disclosure, optionally, at least some of the multiple pixel defining layer openings are different in shapes and/or areas.

In the embodiments of the present disclosure, optionally, at least some of the pixel defining layer openings corresponding to the first sub-pixels and/or the third sub-pixels are different in shapes or areas.

In the embodiments of the present disclosure, optionally, at least some of the pixel defining layer openings corresponding to the first sub-pixels or the third sub-pixels have different minimum distances from their respective adjacent openings.

Embodiments of the present disclosure also provide a high-precision metal mask, which is used to manufacture the display substrate in any of the above embodiments. The first sub-pixel includes multiple films, the second sub-pixel includes multiple films, the third sub-pixel includes multiple films, the mask includes multiple opening regions, and the multiple opening regions includes: a first opening region corresponding to a shape and a distribution of at least one film in the first sub-pixel, or a second opening region corresponding to a shape and a distribution of at least one film in the second sub-pixel, or a third opening region corresponding to a shape and a distribution of at least one film in the third sub-pixel.

A shape represents pattern type and/or size, etc., and a distribution represents spacing, orientation, and/or density, etc.

In some embodiments, a first sub-pixel includes a first effective light-emitting region, a second sub-pixel includes a second effective light-emitting region, a third sub-pixel includes a third effective light-emitting region, and an area of the second effective light-emitting region<an area of the first effective light-emitting region<an area of the third effective light-emitting region. In a display substrate, the total area of all the third effective light-emitting regions included in the third sub-pixels>the total area of all the second effective light-emitting regions included in the second sub-pixels>the total area of all the first effective light-emitting regions included in the first sub-pixels. In some embodiments, each of the first effective light-emitting regions, each of the second effective light-emitting regions, and each of the third effective light-emitting regions are separated. In some embodiments, the first effective light-emitting regions, the second effective light-emitting regions, and the third effective light-emitting regions are defined by multiple separate openings formed in the pixel defining layer. In some embodiments, each first effective light-emitting region is defined by a light-emitting layer that is driven to emit light in the corresponding first sub-pixel, where the light-emitting layer is between opposite anode and cathode in a direction perpendicular to the base substrate. In some embodiments, each second effective light-emitting region is defined by a light-emitting layer that is driven to emit light in the corresponding second sub-pixel, where the light-emitting layer is between opposite anode and cathode in a direction perpendicular to the base substrate. In some embodiments, each third effective light-emitting region is defined by a light-emitting layer that is driven to emit light in the corresponding third sub-pixel, where the light-emitting layer is between opposite anode and cathode in a direction perpendicular to the base substrate. In some embodiments, each of the first effective light-emitting regions, the second effective light-emitting regions, and the third effective light-emitting regions is defined by a corresponding light-emitting layer and a corresponding electrode (anode or cathode) which transports carriers (holes or electrons) with the light-emitting layer or part of the electrode. In some embodiments, each of the first effective light-emitting regions, the second effective light-emitting regions, and the third effective light-emitting regions is defined by at least part of the cathode and at least part of the anode, orthographic projections of which are overlapped on the base substrate, orthographic projections of at least part of the cathode and at least part of the anode do not overlap an orthographic projection of a first insulating layer on the base substrate, and the first insulating layer is located between the cathode and the anode in a direction perpendicular to the base substrate. For example, the first insulating layer includes the pixel defining layer. In some embodiments, each of the first sub-pixels, of the second sub-pixels, and of the third sub-pixels includes a first electrode, a light-emitting layer located on a side of the first electrode away from the base substrate, and a second electrode on a side of the light-emitting layer far from the first electrode; in the direction perpendicular to the base substrate, a second insulating layer is provided between the first electrode and the light-emitting layer, and/or between the second electrode and the light-emitting layer, a projection of the second insulating layer onto the base substrate overlaps with a projection of the first electrode or the second electrode onto the base substrate, and the second insulating layer has an opening; on the side facing the light-emitting layer, the opening of the second insulating layer may expose at least part of the first electrode or the second electrode, so that it may be in contact with the light-emitting layer or an auxiliary light-emitting functional layer; each of the first effective light-emitting regions, the second effective light-emitting regions and the third effective light-emitting regions is defined by a part of the first electrode or the second electrode, where the part is in contact with and the light-emitting layer or the auxiliary light-emitting functional layer. In some embodiments, the second insulating layer includes the pixel defining layer. In some embodiments, the auxiliary light-emitting functional layer may be any one or more of: a hole injection layer, a hole transport layer, an electron transport layer, a hole blocking layer, an electron blocking layer, an electron injection layer, an auxiliary light-emitting layer, an interface improvement layer, or an anti-reflection layer. In some embodiments, the first electrode may be an anode and the second electrode may be a cathode. In some embodiments, the first electrode may include at least two stacked layers of indium tin oxide (ITO) and silver (Ag), for example, including three stacked layers of ITO, Ag and ITO. In some embodiments, the second electrode may include any one or more of: magnesium (Mg), Ag, ITO, or indium zinc oxide (IZO), for example, including a mixed layer or alloy layer of Mg and Ag.

Each sub-pixel includes a light-emitting layer, each first sub-pixel includes a first-color light-emitting layer located in the opening and on the pixel defining layer, and each second sub-pixel includes a second-color light-emitting layer located in the opening and on the pixel defining layer, and each third sub-pixel includes a third-color light-emitting layer located in the opening and on the pixel defining layer.

Figure 7:
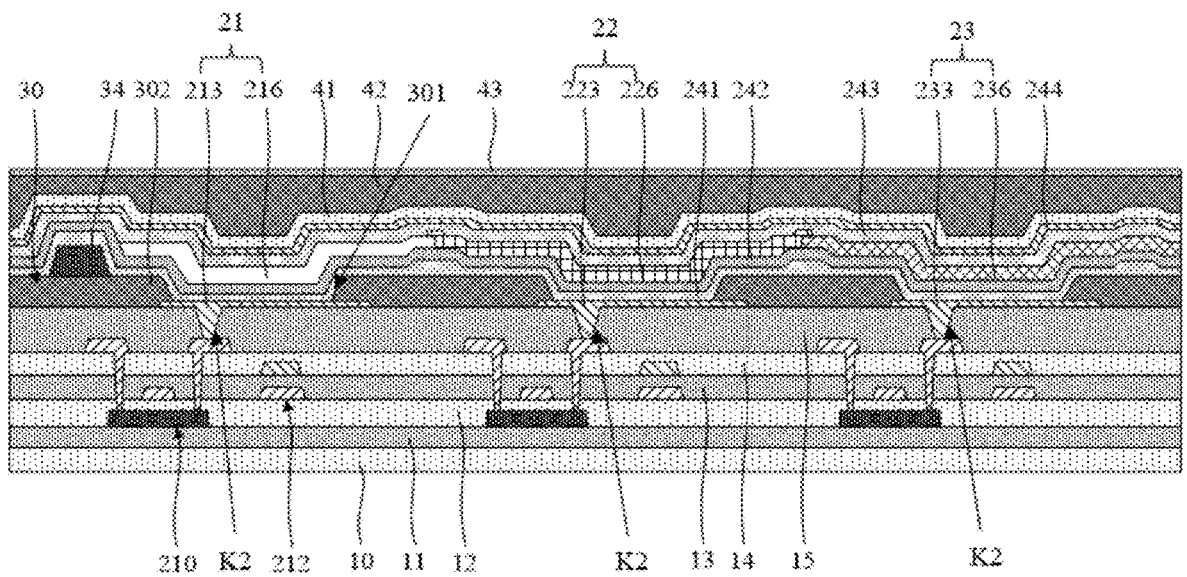
FIG. 7 is a sectional view of a display substrate according to embodiments of the present disclosure.

In some exemplary embodiments, a manufacturing process of the display substrate in the embodiments may include the following steps (1) to (9). The exemplary embodiments are described by taking a flexible display substrate having a top-emission structure (shown in FIG. 7) as an example.

In some exemplary embodiments, the manufacture process of the display substrate of the embodiments may include the following steps (1) to (9). In the exemplary embodiments, reference is made to FIG. 7, and a flexible display substrate with a top-emitting structure is taken as an example for description.

(1) A base substrate is manufactured on a glass plate.

In some exemplary embodiments, the base substrate 10 may be a flexible base substrate, for example, including a first flexible material layer, a first inorganic material layer, a semiconductor layer, a second flexible material layer and a second inorganic material layer that are stacked on the glass plate. The materials of the first flexible material layer and the second flexible material layer are materials such as polyimide (PI), polyethylene terephthalate (PET), or surface-treated polymer soft film, etc. The first inorganic material layer and the second inorganic material layer are made of silicon nitride (SiNx) or silicon oxide (SiOx), etc., to improve water and oxygen resistance of the base substrate. The first inorganic material layer and the second inorganic material layer the layer may also called a barrier layer. The material of the semiconductor layer is amorphous silicon (a-si). In some exemplary embodiments, taking the laminated structure of PI1/Barrier1/a-si/PI2/Barrier2 as an example, the preparation process thereof includes: coating a layer of polyimide on the glass plate and curing it to form a film so as to form the first flexible (PI1) layer; depositing a barrier film on the first flexible layer to form a first barrier (Barrier1) layer covering the first flexible layer; depositing an amorphous silicon film on the first barrier layer to form the amorphous silicon (a-si) layer covering the first barrier layer; coating a layer of polyimide on the amorphous silicon layer, and curing it to form a film so as to form the second flexible (PI2) layer; depositing a barrier film on the second flexible layer to form the second barrier (Barrier2) layer covering the second flexible layer, thereby completing the manufacture of the base substrate 10.

(2) A drive structure layer is manufactured on the base substrate.

The driving structure layer includes multiple driving circuits, and each driving circuit includes multiple transistors and at least one storage capacitor, such as a 2T1C, 3T1C, or 7T1C design.

In some exemplary embodiments, the manufacture process of the driving structure layer may refer to the following description. The manufacture process of the driving circuit of the first sub-pixel 21 is taken as an example for description.

A first insulating film and an active film are sequentially deposited on the base substrate 10, and the active film is patterned through a patterning process, to form a first insulating layer 11 covering the entire base substrate 10, and the active layer pattern arranged on the first insulating layer 11, where the active layer pattern includes at least a first active layer.

A second insulating film and a first metal film are sequentially deposited, and the first metal film is patterned through a patterning process, to form a second insulating layer 12 covering the active layer pattern and a first gate metal layer pattern arranged on the second insulating layer 12, where the first gate metal layer pattern includes at least a first gate electrode and a first capacitor electrode.

A third insulating film and a second metal film are sequentially deposited, and the second metal film is patterned through a patterning process, to form a third insulating layer 13 covering the first gate metal layer and a second gate metal layer pattern arranged on the third insulating layer 13, where the second gate metal layer pattern includes at least a second capacitor electrode, and the position of the second capacitor electrode corresponds to the position of the first capacitor electrode.

A fourth insulating film is deposited, and the fourth insulating film is patterned through a patterning process, to form a pattern of a fourth insulating layer 14 covering the second gate metal layer. The fourth insulating layer 14 is provided with at least two first via holes. Parts of fourth insulating layer 14, the third insulating layer 13, and the second insulating layer 12 in the two first via holes are removed by etching, to expose the surface of the first active layer.

A third metal film is deposited, and the third metal film is patterned through a patterning process, to form a pattern of a source-drain metal layer on the fourth insulating layer 14. The source-drain metal layer includes at least a first source electrode and a first drain electrode located in the display region. The first source electrode and the first drain electrode may be respectively connected to the first active layer through the first via holes.

In the driving circuit of the first sub-pixel 21 in the display region, the first active layer, the first gate electrode, the first source electrode, and the first drain electrode may form a first transistor 210, and the first capacitor electrode and the second capacitor electrode may form a first storage capacitor 212. In the above manufacture process, the driving circuit of the second sub-pixel 22 and the driving circuit of the third-color sub-pixel 23 may be formed at the same time.

In some exemplary embodiments, each of the first insulating layer 11, the second insulating layer 12, the third insulating layer 13, and the fourth insulating layer 14 may use any one or more or composite layer of: silicon oxide (SiOx), silicon nitride (SiNx), or silicon oxynitride (SiON), which may be a single layer, a multi-layer or a composite layer. The first insulating layer 11 is called a buffer layer, which is used to improve the water and oxygen resistance of the base substrate; the second insulating layer 12 and the third insulating layer 13 are called a gate insulator (GI) layer; the fourth insulating layer 14 is called an interlayer dielectric (ILD) layer. The first metal film, the second metal film and the third metal film are made of metal materials, such as any one or more of: silver (Ag), copper (Cu), aluminum (Al), titanium (Ti), or molybdenum (Mo), or alloy materials of the above metals, such as aluminum neodymium alloy (AlNd) or molybdenum niobium alloy (MoNb), each of which may have a single-layer structure or a multilayer composite structure, such as Ti/Al/Ti. The active film uses one or more materials of amorphous indium gallium zinc oxide (a-IGZO), zinc oxynitride (ZnON), indium zinc tin oxide (IZTO), amorphous silicon (a-Si), polysilicon (p-Si), sexithiophene or polythiophene, that is, the present disclosure is applicable to transistors manufactured based on oxide technology, silicon technology, and organic material technology.

(3) A planarization layer is formed on the base substrate on which the aforementioned pattern is formed.

In some exemplary embodiments, a planarization film of organic material is coated on the base substrate 10 on which the aforementioned pattern is formed, to form a planarization (Planarization, PLN) layer 15 covering the entire base substrate 10, and masking, exposure, development processes are used to form multiple second via holes K2 in the planarization layer 15 in the display region. The flat layer 15 in the multiple second via holes K2 is removed by developing, to expose the surface of the first drain electrode of the first transistor 210 of the driving circuit of the first sub-pixel 21, the surface of the first drain electrode of the first transistor the driving circuit of the second sub-pixel 22, and the surface of the first drain electrode of the first transistor of the driving circuit of the third-color sub-pixel 23.

(4) A pattern of a first electrode is formed on the base substrate on which the aforementioned pattern is formed. In some examples, the first electrode is a reflective anode.

In some exemplary embodiments, a conductive film is deposited on the base substrate 10 on which the aforementioned pattern is formed, and the conductive film is patterned through a patterning process to form the pattern of the first electrode. The first anode 213 of the first sub-pixel 21 is connected to the first drain electrode of the first transistor 210 through the second via K2, the second anode 223 of the second sub-pixel 22 is connected to the first drain electrode of the first transistor of the second sub-pixel 22 through the second via K2, and the third anode 233 of the third-color sub-pixel 23 is connected to the first drain electrode of the first transistor of the third-color sub-pixel 23 through the second via hole K2.

In some examples, the first electrode may use a metal material, such as any one or more of: magnesium (Mg), silver (Ag), copper (Cu), aluminum (Al), titanium (Ti), or molybdenum (Mo), or an alloy material of the above metals, such as aluminum neodymium alloy (AlNd) or molybdenum niobium alloy (MoNb), which may have a single-layer structure, or a multilayer composite structure, such as Ti/Al/Ti, etc., or a stacked structure formed by metal and transparent conductive material, for example, reflective material such as ITO/Ag/ITO, Mo/AlNd/ITO, etc.

(5) A pattern of a Pixel Definition Layer (PDL) layer is formed on the base substrate on which the aforementioned pattern is formed.

In some exemplary embodiments, a pixel definition film is coated on the base substrate 10 on which the aforementioned pattern is formed, and the pattern of the pixel definition layer is formed through masking, exposure, and development processes. The pixel definition layer 30 in the display region includes multiple sub-pixel definition portions 302. Multiple pixel definition layer openings 301 are formed between adjacent sub-pixel definition portions 302, and the pixel definition layer 30 in the multiple pixel definition layer openings 301 is removed by developing, to expose at least part of the surface of the first anode 213 of the first sub-pixel 21, at least part of the surface of the second anode 223 of the second sub-pixel 22, and at least part of the surface of the third anode 233 of the third-color sub-pixel 23.

In some examples, the pixel definition layer 30 may use polyimide, acrylic, polyethylene terephthalate, or the like.

(6) A pattern of post spacers (PS) is formed on the base substrate on which the aforementioned pattern is formed.

In some exemplary embodiments, a film of organic material is coated on the base substrate 10 on which the aforementioned pattern is formed, and the pattern of post spacers 34 is formed through processes of masking, exposure, and development. The pattern of post spacers 34 may be used as a support layer and are configured to support the FMM during the evaporation process. In some examples, in the row arrangement direction of the sub-pixels, there is a repeating unit between two adjacent post spacers 34. For example, the post spacer 34 may be located in the first sub-pixel 21 and third-color sub-pixel 23 that are adjacent.

(7) On the base substrate on which the aforementioned pattern is formed, an organic functional layer and a second electrode are sequentially formed.

In some examples, the second electrode is a transparent cathode. The light-emitting element may emit light from a side away from the base substrate 10 through the transparent cathode to achieve top emission. In some examples, the organic functional layer of the light-emitting element includes: a hole injection layer, a hole transport layer, a light-emitting layer, and an electron transport layer.

In some exemplary embodiments, the hole injection layer 241 and the hole transport layer 242 are sequentially formed through evaporation by using an open mask on the base substrate 10 on which the aforementioned pattern is formed, then FMM is used to sequentially form, through evaporation, a blue light-emitting layer 236, a green light-emitting layer 216, and a red light-emitting layer 226, and then an open mask is used to sequentially form, through evaporation, the electron transport layer 243, the cathode 244, and the optical coupling layer. The hole injection layer 241, the hole transport layer 242, the electron transport layer 243, and the cathode 244 are common layers for multiple sub-pixels.

In some examples, the organic functional layer may further include a microcavity adjustment layer located between the hole transport layer and the light-emitting layer. For example, after forming the hole transport layer, FMM may be used to sequentially form, through evaporation, a blue microcavity adjustment layer, a blue light-emitting layer, a green microcavity adjustment layer, a green light-emitting layer, a red microcavity adjustment layer, and a red light-emitting layer.

In some exemplary embodiments, the organic functional layer is formed in the sub-pixel region to realize the connection between the organic functional layer and the anode. The cathode is formed on the pixel definition layer and connected with the organic functional layer.

In some exemplary embodiments, the cathode may use any one or more of magnesium (Mg), silver (Ag), aluminum (Al), or use an alloy made of any one or more of the foregoing metals, or use a transparent conductive material, such as indium tin oxide (ITO), or a multilayer composite structure of metal and transparent conductive material.

In some exemplary embodiments, the optical coupling layer may be formed on a side of the cathode 244 away from the base substrate 10, and the optical coupling layer may be a common layer for multiple sub-pixels. The optical coupling layer may cooperate with the transparent cathode to increase the light output. For example, the material of the optical coupling layer may be a semiconductor material. However, the embodiments are not limited thereto.

(8) An encapsulation layer is formed on the base substrate on which the aforementioned pattern is formed.

In some exemplary embodiments, the encapsulation layer is formed on the base substrate 10 on which the aforementioned pattern is formed, and the encapsulation layer may include a first encapsulation layer 41, a second encapsulation layer 42, and a third encapsulation layer 43 that are stacked. The first encapsulation layer 41 uses inorganic material and covers the cathode 244 in the display region. The second encapsulation layer 42 uses organic material. The third encapsulation layer 43 uses inorganic material and covers the first encapsulation layer 41 and the second encapsulation layer 42. However, the embodiments are not limited thereto. In some examples, the encapsulation layer may adopt a five-layer structure including inorganic/organic/inorganic/organic/inorganic layers.

The above descriptions illustrate some implementations of the present disclosure. It should be noted that for those skilled in the art, without departing from the principles of the present disclosure, various improvements and modifications may be made. These improvements and modifications shall fall within the protection scope of the present disclosure.

The invention claimed is:
1. A display substrate, comprising first sub-pixels, second sub-pixels and third sub-pixels;
wherein in a first direction, the first sub-pixels and the third sub-pixels are arranged alternately to form first sub-pixel rows, and the second sub-pixels form second sub-pixel rows;
wherein in a second direction, the first sub-pixel rows and the second sub-pixel rows are arranged alternately, and the first direction is approximately perpendicular to the second direction;
wherein two first sub-pixels and two third sub-pixels in two adjacent rows and two adjacent columns form a 2*2 array, in the 2*2 array, the two first sub-pixels are in different rows and in different columns, the two third sub-pixels are in different rows and in different columns, at least one sub-pixel of the two first sub-pixels and the two third sub-pixels is a pattern where a corner is cut off or a pattern where three corners are cut off, connection lines of centers of the two first sub-pixels and the two third sub-pixels form a virtual quadrilateral that is non-square, and a second sub-pixel is within the virtual quadrilateral.
2. The display substrate according to claim 1, wherein the at least one sub-pixel of the two first sub-pixels and the two third sub-pixels is a pattern of a square where a corner is cut off.

3. The display substrate according to claim 1, wherein for the two first sub-pixels corresponding to a same virtual quadrilateral, positions where corners are cut off are the same or different; or,
for the two third sub-pixels corresponding to a same virtual quadrilateral, positions where corners are cut off are the same or different.

4. The display substrate according to claim 1, wherein the two first sub-pixels and the two third sub-pixels corresponding to a same virtual quadrilateral surround a second sub-pixel, and a minimum distance among distances from other first sub-pixels and other third sub-pixels outside the same virtual quadrilateral to the surrounded second sub-pixel is greater than a minimum distance among distances from the two first sub-pixels and the two third sub-pixels corresponding to the same virtual quadrilateral to the surrounded second sub-pixel.

5. The display substrate according to claim 1, wherein,
vertical distances from edges of the two first sub-pixels corresponding to a same virtual quadrilateral that are close to the second sub-pixel to a center of the second sub-pixel are equal; and/or,
vertical distances from edges of the two third sub-pixels corresponding to a same virtual quadrilateral that are close to the second sub-pixel to a center of the second sub-pixel are equal; and/or,
vertical distances from edges of the two first sub-pixels corresponding to a same virtual quadrilateral that are close to the second sub-pixel to a center of the second sub-pixel are equal to vertical distances from edges of the two third sub-pixels corresponding to the same virtual quadrilateral that are close to the second sub-pixel to the center of the second sub-pixel.

6. The display substrate according to claim 1, wherein:
in at least one virtual quadrilateral, distances from a center of the second sub-pixel to the centers of the two third sub-pixels are not equal, and distances from the center of the second sub-pixel to the centers of the two first sub-pixels are equal; or,
in at least one virtual quadrilateral, distances from a center of the second sub-pixel to the centers of the two third sub-pixels are equal, and distances from the center of the second sub-pixel to the centers of the two first sub-pixels are equal; or,
in at least one virtual quadrilateral, distances from a center of the second sub-pixel to the centers of the two third sub-pixels are equal, and distances from the center of the second sub-pixel to the centers of the two first sub-pixels are not equal.

7. The display substrate according to claim 1, wherein each of the distances from the centers of the two first sub-pixels and the centers of the two third sub-pixels corresponding to a same virtual quadrilateral to a center of the second sub-pixel is within a range of 20 μm to 60 μm.

8. The display substrate according to claim 1, wherein each of all interior angles of the virtual quadrilateral is within a range of 70° to 120°.

9. The display substrate according to claim 1, wherein sixteen virtual quadrilaterals in an array form a virtual polygon, and the sixteen virtual quadrilaterals have the same arrangement of interior angles.

10. The display substrate according to claim 1, wherein four virtual quadrilaterals in an array form a virtual polygon comprising two types of virtual quadrilaterals, and two diagonal virtual quadrilaterals of the four virtual quadrilaterals have the same arrangement of interior angles; or, wherein four virtual quadrilaterals in an array form a virtual polygon comprising three types of virtual quadrilaterals, and two diagonal virtual quadrilaterals of the four virtual quadrilaterals have the same arrangement of interior angles.

11. The display substrate according to claim 1, wherein the centers of the first sub-pixels in a same row are on a straight line parallel to a row direction, and/or the centers of the first sub-pixels in a same column are on a straight line parallel to a column direction; or,
wherein the centers of the third sub-pixels in a same row are on a straight line parallel to a row direction, and/or the centers of the third sub-pixels in a same column are on a straight line parallel to a column direction.

12. The display substrate according to claim 1, wherein connection lines of centers of four first sub-pixels surrounding each first sub-pixel form a square, the center of the first sub-pixel is at a center of the square, and two first sub-pixels on a diagonal of the square are symmetrical about the first sub-pixel at the center of the square; or,
wherein connection lines of centers of four third sub-pixels surrounding each third sub-pixel form a square, the center of the third sub-pixel is at a center of the square, and two third sub-pixels on a diagonal of the square are symmetrical about the third sub-pixel at the center of the square.

13. The display substrate according to claim 1, wherein the first sub-pixel is a red sub-pixel, the second sub-pixel is a green sub-pixel, and the third sub-pixel is a blue sub-pixel.

14. A display device, comprising the display substrate according to claim 1.

15. The display device according to claim 14, further comprising a pixel defining layer, wherein the pixel defining layer comprises a plurality of pixel defining layer openings, each of the first sub-pixels, the second sub-pixels and the third sub-pixels corresponds to a pixel defining layer opening of the plurality of pixel defining layer openings, and shapes of the first sub-pixel, the second sub-pixel and the third sub-pixel are approximately the same as shapes of their respective pixel defining layer openings.

16. A display substrate, comprising first sub-pixels, second sub-pixels and third sub-pixels;
wherein, in a first direction, the first sub-pixels and the third sub-pixels are arranged alternately to form first sub-pixel rows, and the second sub-pixels form second sub-pixel rows;
wherein in a second direction, the first sub-pixel rows and the second sub-pixel rows are arranged alternately, and the first direction is approximately perpendicular to the second direction;
wherein two first sub-pixels and two third sub-pixels in two adjacent rows and two adjacent columns form a 2*2 array, in the 2*2 array, the two first sub-pixels are in different rows and in different columns, the two third sub-pixels are in different rows and in different columns, connection lines of centers of the two first sub-pixels and the two third sub-pixels form a virtual quadrilateral that is non-square, and a second sub-pixel is within the virtual quadrilateral;
wherein four virtual quadrilaterals form a hexagon comprising two parallel edges, wherein:
the four virtual quadrilaterals share one first sub-pixel, a first edge of the two parallel edges passes through a first sub-pixel, a third sub-pixel and another first sub-pixel, a second edge of the two parallel edges passes through a first sub-pixel, a third sub-pixel and another first sub-pixel, and a connection line of centers of two third sub-pixels on the two parallel edges does not pass through a center of the first sub-pixel shared by the four virtual quadrilaterals; or, the four virtual quadrilaterals share one third sub-pixel, a first edge of the two parallel edges passes through a third sub-pixel, a first sub-pixel and another third sub-pixel, a second edge of the two parallel edges passes through a third sub-pixel, a first sub-pixel and another third sub-pixel, and a connection line of centers of two first sub-pixels on the two parallel edges does not pass through a center of the third sub-pixel shared by the four virtual quadrilaterals;

wherein at least one sub-pixel of the two first sub-pixels and the two third sub-pixels is a pattern where one corner is cut off or a pattern where three corners are cut off.

17. The display substrate according to claim 16, wherein vertices or the two parallel edges of the hexagon pass through eight sub-pixels comprising four first sub-pixels and four third sub-pixels, and the first sub-pixels and the third sub-pixels in the eight sub-pixels are alternately arranged; wherein:

a connection line of centers of two adjacent first sub-pixels in the eight sub-pixels is an edge of the two parallel edges of the hexagon, and a connection line of the center of one first sub-pixel of the two adjacent first sub-pixels and a center of another first sub-pixel adjacent to the one first sub-pixel does not pass through a center of the third sub-pixel between the one first sub-pixel and the another first sub-pixel; or a connection line of centers of two adjacent third sub-pixels in the eight sub-pixels is an edge of the two parallel edges of the hexagon, and a connection line of the center of one third sub-pixel of the two adjacent third sub-pixels and a center of another third sub-pixel adjacent to the one third sub-pixel does not pass through a center of the first sub-pixel between the one third sub-pixel and the another third sub-pixel.

* * * * *